(12) United States Patent
Lai

(10) Patent No.: US 9,132,513 B2
(45) Date of Patent: Sep. 15, 2015

(54) DEVICE FOR ASSEMBLING PHOTOELECTRIC ELEMENT ON SUBSTRATE

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 110 days.

(21) Appl. No.: 13/931,759

(22) Filed: Jun. 28, 2013

(65) Prior Publication Data
US 2014/0252072 A1    Sep. 11, 2014

(30) Foreign Application Priority Data
Mar. 8, 2013  (TW) .............................. 102108328 A

(51) Int. Cl.
| | |
|---|---|
| H01L 21/00 | (2006.01) |
| B23K 31/12 | (2006.01) |
| H01L 31/02 | (2006.01) |
| H01L 23/00 | (2006.01) |

(52) U.S. Cl.
CPC ................ *B23K 31/12* (2013.01); *H01L 24/75* (2013.01); *H01L 31/02* (2013.01); *H01L 24/83* (2013.01); *H01L 2224/29099* (2013.01); *H01L 2224/32238* (2013.01); *H01L 2224/753* (2013.01); *H01L 2224/7592* (2013.01); *H01L 2224/75745* (2013.01); *H01L 2224/838* (2013.01); *H01L 2224/83201* (2013.01)

(58) Field of Classification Search
CPC ....................................................... B23K 31/12
See application file for complete search history.

(56) References Cited

U.S. PATENT DOCUMENTS

| | | | | |
|---|---|---|---|---|
| 3,462,577 | A | * | 8/1969 | Helms et al. ................. 219/91.1 |
| 3,559,054 | A | * | 1/1971 | Bowers .......................... 324/713 |
| 6,995,342 | B2 | * | 2/2006 | Yamauchi et al. .......... 219/444.1 |
| 2010/0103630 | A1 | * | 4/2010 | Tanaka et al. ................. 361/749 |

FOREIGN PATENT DOCUMENTS

| | | | | |
|---|---|---|---|---|
| JP | 05291353 | A | * | 11/1993 |
| JP | 09107008 | A | * | 4/1997 |
| JP | 2010258233 | A | * | 11/2010 |

* cited by examiner

*Primary Examiner* — Devang R Patel
(74) *Attorney, Agent, or Firm* — Novak Druce Connolly Bove + Quigg LLP

(57) ABSTRACT

A device includes a vacuum nozzle, a driver, a measuring unit, and a controller. The nozzle lifts and holds a photoelectric element having a first electrode and a second electrode. The driver drives the nozzle to press the photoelectric element onto a substrate having a soldering pad and a contact, such that the second electrode is electrically connected to the soldering pad via a layer of conductive glue. The measuring unit measures a resistance across the first electrode and the contact of the substrate when the photoelectric element is pressed onto the substrate. The controller controls the driver to drive the nozzle to keep pressing the photoelectric element harder and harder into the substrate until the resistance stops decreasing, that is, when the layer of conductive glue is at its thinnest.

3 Claims, 2 Drawing Sheets

DEVICE FOR ASSEMBLING PHOTOELECTRIC ELEMENT ON SUBSTRATE

BACKGROUND

1. Technical Field

The present disclosure relates to optical connectors and, more particularly, to a device for assembling a photoelectric element on a substrate.

2. Description of Related Art

Optical connectors include a substrate and a photoelectric element such as a light emitter or a light receiver positioned on and electrically connected to the substrate via conductive glue. In assembly, to reduce insertion loss, the photoelectric element is pressed to the substrate to reduce electrical resistance as far as possible between the photoelectric element and the substrate. However, if the pressure is over heavy, the photoelectric element may be damaged.

Therefore, it is desirable to provide a device for assembling a photoelectric element on a substrate, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will be described with reference to the drawings.

Figure 1:
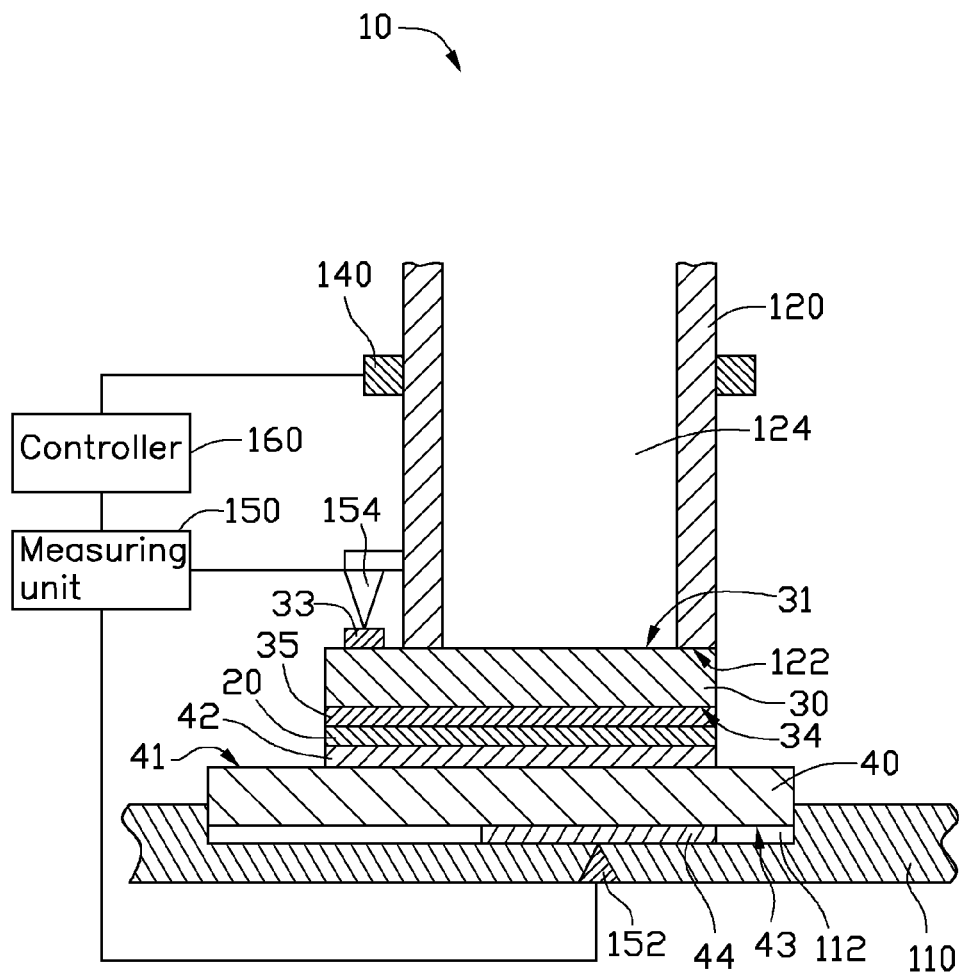
FIG. 1 is a schematic view of a device for assembling a photoelectric element onto a substrate, according to an embodiment.

Referring to FIG. 1, a device 10, according to an embodiment, assembles a photoelectric element 30 onto a substrate 40 using a layer of conductive glue 20.

The photoelectric element 30 includes a first surface 31, a plate-shaped first electrode 33 positioned on the first surface 31, a second surface 34 opposite to the first surface 31, and a plate-shaped second electrode 35 covering the second surface 34. The photoelectric element 30 can be a light emitter, such as a light emitting diode and a laser diode, or a light receiver, such as a photo diode.

The conductive glue 20 is applied to a surface of the second electrode 35 facing away from the second surface 34.

The substrate 40 includes a third surface 41, a soldering pad 42 positioned on the third surface 41 and corresponding to the second electrode 35 in shape and size, a fourth surface 43 opposite to the third surface 41, and a contact 44 positioned on the fourth surface 43 and electrically connected to the soldering pad 42.

The device 10 includes a tray 110, a vacuum nozzle 120, a driver 140, a measuring unit 150, and a controller 160.

The tray 110 defines a recess 112 for receiving the substrate 40.

The nozzle 120 applies a vacuum to the first surface 31. In detail, the nozzle 120 includes a sucking surface 122 contacting the first surface 31 and a hole 124 defined in the sucking surface 122 and communicating with a vacuum pump (not shown) to reduce air pressure at the vacuum nozzle 120.

The driver 140, such as a mechanical arm, is positioned around the tray 110 and is connected to the nozzle 120. The driver 140 moves and aligns the second electrode 35 with the soldering pad 42 and then presses the photoelectric element 30 onto the substrate 40.

The measuring unit 150, such as an ohmmeter, includes a first probe 152 and a second probe 154. The first probe 152 is buried in the tray 110 and makes contact with the contact 44. The second probe 154 is connected to the nozzle 120 and contacts the first electrode 33 when the photoelectric element 30 is pressed by the nozzle 120 onto the substrate 40. The measuring unit 150 measures resistance between the first electrode 33 and the contact 44. In principle, the resistance is a sum of the resistances between the first electrode 33 and the second electrode 35 (i.e., the resistance of the photoelectric element 30), a contact resistance between the photoelectric element 30 and the substrate 40, and a resistance between the soldering pad 42 and the contact 44.

Figure 2:
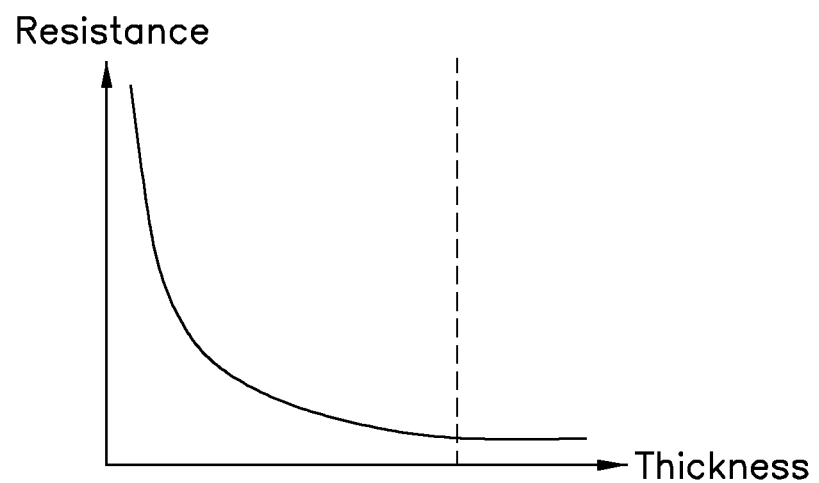
FIG. 2 is a graph showing a relationship between a contact resistance between a photoelectric element and a substrate and a thickness of conductive glue connecting the photoelectric element and the substrate.

In particular, during the pressing, the electrical resistance between the first electrode 33 and the second electrode 35 and the resistance between the soldering pad 42 and the contact 44 remain unchanged. However, the conductive glue 20, being compressed, becomes thinner and thinner until the conductive glue 20 is compressed to the maximum degree, and thus the contact resistance between the photoelectric element 30 and the substrate 40 decreases until the conductive glue 20 is compressed to the maximum degree (see FIG. 2). That is, after the conductive glue 20 is compressed to the maximum degree, the contact resistance between the photoelectric element 30 and the substrate 40, having achieved the minimum resistance possible, remains unchanged, and the photoelectric element 30 might be damaged if further physical pressure was applied.

The controller 160 controls the driver 140 to press the photoelectric element 30 according to the contact resistance. In detail, the controller 160 controls the driver 140 to maintain and increase the physical pressing of the photoelectric element 30 until the contact resistance stops decreasing.

As such, the device 10 monitors the pressing in real time to reduce insertion loss while avoiding damage to the photoelectric element 30.

To increase efficiency, in other embodiments, the tray 110 can define a number of recesses 112, which can be arrayed, for receiving a number of the substrates 40. Accordingly the measuring unit 150 can include a number of the first probes 152 to make contact with the number of contacts 44.

It will be understood that the above particular embodiments are shown and described by way of illustration only. The principles and the features of the present disclosure may be employed in various and numerous embodiments thereof without departing from the scope of the disclosure. The above-described embodiments illustrate the possible scope of the disclosure but do not restrict the scope of the disclosure.

What is claimed is:

1. A device, comprising:
   a nozzle configured to suck a photoelectric element having a first electrode and a second electrode, wherein the photoelectric element comprises a first surface and a second surface opposite to the first surface, the first electrode is positioned on the first surface, the second electrode is positioned on the second surface, the nozzle is configured to suck the first surface, and the nozzle comprises a sucking surface contacting the first surface and a negative pressure hole defined in the sucking surface;

a driver configured to drive the nozzle to press the photoelectric element onto a substrate having a soldering pad and a contact such that the second electrode is electrically connected to the soldering pad;

a tray defining a recess for receiving the substrate, wherein the substrate comprises a third surface and a fourth surface opposite to the third surface, the soldering pad is positioned on the third surface and corresponding to the second electrode in shape and size, the contact is positioned on the fourth surface and electrically connected with the soldering pad;

a measuring unit configured to measure a resistance across the first electrode and the contact when the photoelectric element is pressed onto the substrate, wherein the measuring unit comprises a first probe and a second probe, the first probe is buried in the tray and contacts the contact, and the second probe is connected to the nozzle and contacts the first electrode when the photoelectric element is pressed by the nozzle to the substrate; and a controller configured to control the driver to drive the nozzle to keep pressing the photoelectric element until the resistance stops decreasing.

2. The device of claim 1, wherein the driver is a mechanical arm.

3. The device of claim 1, wherein the measuring unit is an Ohmmeter.

* * * * *